United States Patent [19]
Kraus et al.

[11] Patent Number: 4,803,595
[45] Date of Patent: Feb. 7, 1989

[54] INTERPOSER CHIP TECHNIQUE FOR MAKING ENGINEERING CHANGES BETWEEN INTERCONNECTED SEMICONDUCTOR CHIPS

[75] Inventors: Charles J. Kraus, Poughkeepsie; Leon L. Wu, Hopewell Junction, both of N.Y.

[73] Assignee: International Business Machines Corporation, Armonk, N.Y.

[21] Appl. No.: 129,404

[22] Filed: Nov. 25, 1987

Related U.S. Application Data
[63] Continuation of Ser. No. 931,488, Nov. 17, 1986, abandoned.

[51] Int. Cl.[4] .............................................. H05K 1/18
[52] U.S. Cl. ................................... 361/412; 174/68.5; 361/416
[58] Field of Search ............... 361/412, 416; 174/68.5, 174/52 FP

[56] References Cited

U.S. PATENT DOCUMENTS
4,349,862  9/1982  Bajorek et al. ................. 174/68.5 X
4,489,364  12/1984 Chance et al. ...................... 361/395
4,641,425  2/1987  Dubuisson ...................... 174/68.5 X

OTHER PUBLICATIONS
A. Truch, Two-Level Printed Circuit Card, IBM Tech. Disc. Bull., v. 14, #11, Apr. 1972, p. 3482 relied on.
O. R. Abolafia, Chip Interconnection Device, IBM Tech. Disc. Bull., v. 15, #2, Jul. 1972, p. 420 relied on.
Jerry Lyman, Growing Pin Count is Forcing LSI Package Changes, Electronics, Mar. 17, 1977, pp. 86 to 89 relied on.
M. T. McMahon, Semiconductor Device Carrier for Modules, IBM Tech. Disc. Bull., v. 18, #5, Oct. 1975, pp. 1440 & 1441 relied on.
IBM Technical Disclosure Bulletin, vol. 27, No. 8, Jan. 1985, pp. 4672–4673, by J. M. Harvilchuck et al, "Interposed Segmented Chip Carrier".
IBM Technical Disclosure Bulletin, vol. 26, No. 9, Feb. pp. 4590–4591, by I. Feinberg et al, "Interposer for Chip-on-Chip Module Attachment".
IBM Technical Disclosure Bulletin, vol. 24, No. 9, Feb. 1982, pp. 4637–4638, by M. E. Ecker, "Chip Carrier Interface with Signal Path Change Capability".
IBM Technical Disclosure Bulletin, vol. 22, No. 5, Oct. 1979, pp. 1841–1842 by A. H. Johnson et al. "Multilayer Ceramic Fixed Layer Substrate Design".

*Primary Examiner*—R. R. Kucia
*Attorney, Agent, or Firm*—Steven J. Meyers; Yen S. Yee

[57] ABSTRACT

Engineering changes in the wiring between semiconductor device chips supported on the same substrate are made using minimum substrate real estate and without the use of engineering change pads or discrete wires by the use of easily modified chip interposers. The interposers are inserted between respective chips and the substrate. The interposers comprise conductive vias and multiple internal wiring planes which are selectively connected to the vias.

6 Claims, 3 Drawing Sheets

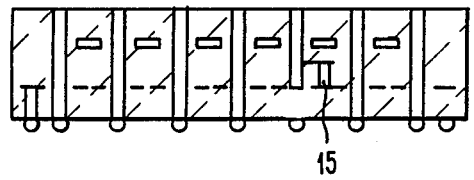
FIG. 3A  INTERPOSER 3
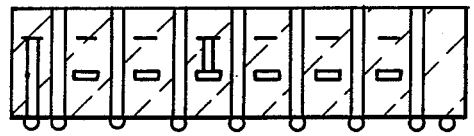
FIG. 3B  INTERPOSER 9
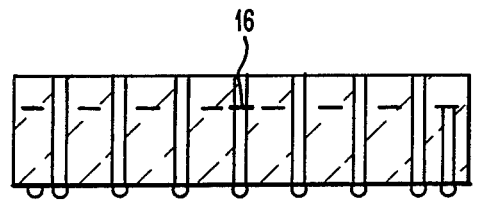
FIG. 3C  INTERPOSER 7

INTERPOSER CHIP TECHNIQUE FOR MAKING ENGINEERING CHANGES BETWEEN INTERCONNECTED SEMICONDUCTOR CHIPS

This application is a continuation of copending application Ser. No. 931,488, filed on Nov. 17, 1986, which has now been abandoned.

BACKGROUND OF THE INVENTION

The present invention generally relates to techniques for making engineering changes in the wiring between semiconductor device chips carried on the same substrate and, more particularly, to the use of interposer chips mounted between the device chips and the substrate for making such changes.

As discussed in copending patent application Ser. No. 792,708, filed Oct. 28, 1985 in the name of Charles T. Ryan, for "Method and Structure for Effecting Engineering Changes in a Multiple Device Module Package" and assigned to the present assignee, it is the practice in modern packaging technology to mount many integrated circuit chip devices on a common substrate which interconnects the devices with each other and to I/O's at the end or on the opposite surface of the substrate. Such substrates normally are constructed of layered green ceramic sheets having thousands of vias and printed lines that form the internal circuit network. After the substrate has been laminated and sintered, there is no practical method of changing the buried internal network. However, it becomes necessary quite frequently to modify the internal circuitry to (1) correct defective lines and/or vias and (2) make changes in the basic circuitry to accommodate design changes to upgrade the package or modify it by the use of different devices or the like.

As further discussed in said copending patent application, a number of engineering change (EC) schemes have been developed to modify the interconnection network between device chips, i.e., to disrupt the unwanted part of the network and to substitute a replacement network part. In known schemes, the network disruptions and replacements are accomplished through the use of "fan-out" networks with or without EC pads that are physically located in spaces between the device chips along the surface of the substrate on which the device chips are mounted. Such spaces prevent the device chips from being arranged with maximum packing density on the substrate with the result that circuit path length in the interchip network is undesirably lengthened, with attendant performance penalty. This penalty remains to be more fully addressed, although some progress has been made in reducing performance delays, due to inductance in the replacement network, by the use of chip metalization techniques rather than the use of discrete wires. Examples of such progress are disclosed in the aforesaid copending patent application and in the IBM ® Technical Disclosure Bulletin paper, "Interposed Segmented Chip Carrier" by J. M. Harvilchuck et al., Vol. 27, No. 8, January 1985, page 4672. It is to be noted, however, that the cited Technical Disclosure Bulletin does not provide a full engineering change capability in that only changes in the chip signal redistribution network pattern are relatively easily made. Any change required in substrate wiring would necessitate the costly and time-consuming fabrication of a new substrate. This would be the case, for example, where a new network is to be added, an additional load is to be added to an existing network or a network is to be rerouted.

SUMMARY OF THE INVENTION

The present invention provides full engineering change capability by only changing interposers without requiring any substrate changes. Engineering changes in the wiring between chips on the same substrate are made using minimum substrate real estate and without the use of EC pads or discrete wires which slow down machine performance. Such changes are made by easily modified chip interposers, inserted between the device chips to be wired together and the substrate.

The interposers comprise conductive vias and multiple internal wiring planes selectively connected to the vias. Wiring changes between the device chips are effected by changing the connections within appropriate interposers between selected ones of the conductive vias and the multiple wiring planes and between the multiple wiring planes themselves. In general, three interposers need be changed for a given EC: the two interposers located directly beneath the two device chips to be connected together and a third interposer located on the substrate at a third site where the direction of the chip interconnection wiring is required to change. The interposer changes are readily made by the addition of short jumper metallurgy between appropriate internal wiring planes and vias and by failing to punch other vias where unwanted connections are to be avoided.

BRIEF DESCRIPTION OF THE DRAWING

FIGS. 3a, 3b and 3c are simplified cross-sectional views of the three interposers involved in making the EC illustrated in FIG. 3.

BEST MODE FOR CARRYING OUT THE INVENTION

Figure 1:
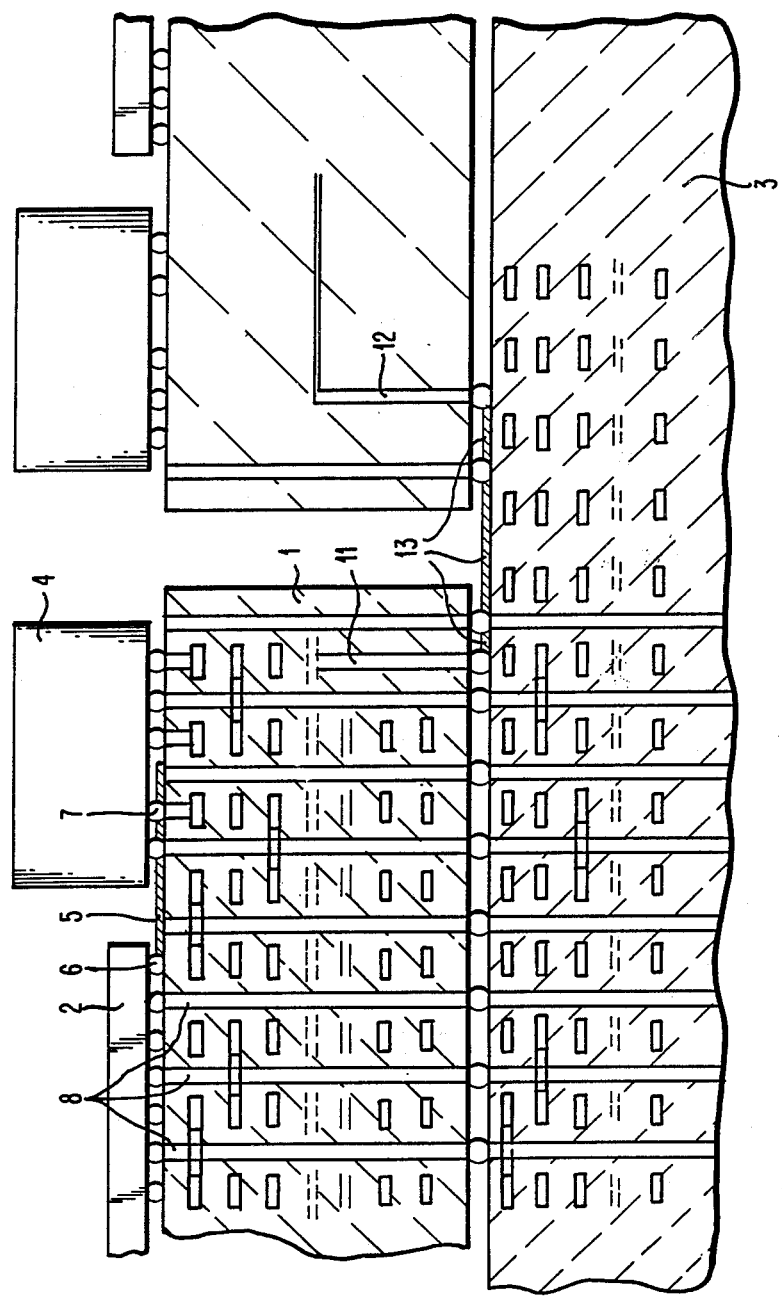
FIG. 1 is a cross-sectional view of a module showing two interposers, in accordance with the invention, each carrying a device chip and a decoupling capacitor.

Referring to FIG. 1, engineering change (EC) interposer 1 is placed between device chip 2 and substrate 3. One or more decoupling capacitors 4 are also mounted upon interposer 1 adjacent to chip 2. Each interposer comprises a series of stacked sintered green sheet having respective metallization layers thereon such as voltage distribution patterns ($V_T$, $V_R$, and $V_C$), EC wiring layers (x and y) and redistribution layer (Redist). Short fan-out conductors 5 are placed on the surface of interposer 1 to provide signal or power connections such as connections between capacitor 4 and chip 2 at contacting points such as 6 and 7 not directly accessible to the signal and power vias 8 which run through interposer 1 and substrate 3. It will be noted that fewer vias are provided than the number of chip contact points (e.g., solder balls) such as contact point 6.

Figure 2:
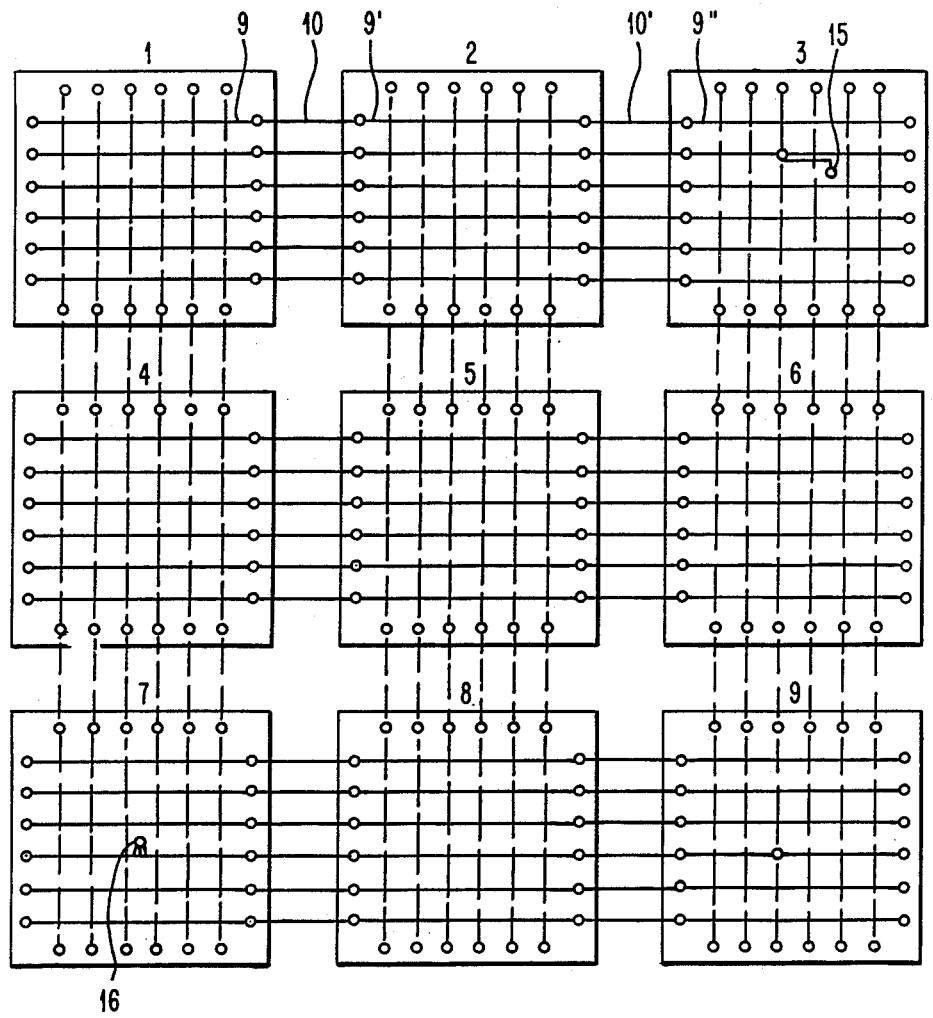
FIG. 2 is a plan view of a matrix of interposers illustrating a wiring change (EC) between two device chip locations in accordance with the invention.

Substrate 3 is conventional in nature and comprises many levels of metallization (several of which are shown) for the interconnection of the interposers 1 supported thereon and for the application of operating voltages and signals to the device chips via the respective interposers. Metallized ceramic sheet construction typically is used for substrate 3 as well as for interposers 1. FIG. 2 schematically represents the manner in which the interposers are connected to each other via the substrate 3. Each of the x (EC) wiring lines of a given interposer (such as line 9 of interposer 1) normally is connected to its corresponding line of all other interposers in the same row (such as line 9' of interposer 2 and line 9" of interposer 3). A corresponding relationship is true of the y (EC) wiring lines as can be seen from FIG. 3. The bridging lines (such as line 10 and 10') are provided by corresponding vias (such as vias 11 and 12) of adjacent interposers and surface metallization (such as 13) on the substrate as shown in FIG. 1.

In order to effect an EC, it is necessary to disrupt the normal connections between the x lines of the interposers and between the y lines of the interposers. This can be done simply by not punching the appropriate via holes (such as 11 and 12) when fabricating the replacement interposers which lie at the beginning and at the end of the replacement (EC) network. It is also necessary to modify the interposers at the location where the direction of the replacement (EC) network lines change. This can best be understood by reference to FIGS. 2 and 3a, 3b and 3c.

The example shown in FIG. 3 assumes that via LST 15 on interposer 3 is to be connected to via LST 16 on interposer 7 using the EC technique of the invention. The replacement interposers 3, 9 and 7 to effectuate the desired EC are shown in FIG. 3. First, in the replacement interposer 3, the normally present via 15 of FIG. 3a is not punched in the bottom sheet of the interposer in the via stack normally making connection to the LST in the substrate. It is to be noted, at this juncture, that FIGS. 3a, 3b and 3c are simplified to highlight the x and y (EC) layers of the respective interposers which are directly involved in making the EC. Other layers such as $V_T$, $V_R$ and $V_C$ have been omitted for the sake of simplicity and clarity of exposition. The failure to punch the via, as discussed, effectively abandons the pre-existing but no longer desired interconnection network.

The desired replacement (EC) network is established by making connections 15 and 16 to the appropriate x and y wires of interposers 3 and 7 as shown in FIGS. 2, 3a and 3c. Inasmuch as the x and y wires of the interposers normally are connected row-wise and column-wise as shown in FIG. 2, it becomes necessary to remove the vias on the interposers to interrupt the wire connections in the direction not selected. Thus, additional vias are not punched in interposers 3, 9 and 7 as shown in FIGS. 3a, 3b and 3c. The additional connections and line structures (such as 15 and 16 of FIGS. 3a and 3c) can be added to the green sheets to be used in the replacement interposers by metallization writing techniques available in the art and used as well in the fabrication of the substrate 3 of FIG. 1.

The redistribution layer represented in FIG. 1 preferably is added to each interposer to offer more degrees of freedom in making connections from the via in the interposer to an x and y EC line. Should adjacent lines be already in use, a short jumper on the redistribution layer can be used to connect the via in question to another nearby but non-adjacent x or y line.

It can be seen from the foregoing discussion that the following features are characteristic of the present invention:

EC's can be made without the need for extra module space to provide for fan-out lines or EC pads. Only a few interposers need be replaced when making a given EC without modification of the remainder of the module. The performance of the module is not adversely affected by the presence of the EC replacement interposers so that development and testing of the module may proceed unimpeded. The replacement interposers can be simply and economically made with fast EC turn around time.

What is claimed is:

1. A structure for making engineering changes to form a replacement wiring network between designated chips on a common substrate without requiring any changes to the common substrate or the use of discrete wires, said structure comprising:
   interposers being located between each of said designated chips and said common substrate,
   each interposer having conductive vias and stacked internal multiple wiring planes insulated from each other and from said vias,
   said vias making electrical connections between said chips and said substrate so that said chips are connected to each other and to said common substrate via said interposers, and
   replacement interposers which lie at the beginning and at the end of the replacement wiring network for making engineering change connections without the use of discrete wires and associated engineering change pads so that the electrical connections between said chips are changeable in accordance with changes in the connections between said vias and said wiring planes of said replacement interposers.

2. The structure set forth in claim 1 and further including:
   an additional conductive via on a selected interposer for making electrical connection between two of said planes.

3. The structure set forth in claim 1 wherein said planes include planes having spaced paralleled conductors running in orthogonal directions.

4. The structure set forth in claim 3 and further including a conductive via extending between and connecting a first plane having spaced paralleled conductors running in a first direction and a second plane having spaced paralleled conductors running in a second direction perpendicular to said first direction.

5. The structure set forth in claim 1 wherein at least one of said conductive vias extends only partially through at least one of said replacement interposers.

6. The structure set forth in claim 5 and further including means for electrically connecting one of said wiring planes to said at least one of said conductive vias.

* * * * *